(12) United States Patent
Yoshikawa et al.

(10) Patent No.: US 8,530,267 B2
(45) Date of Patent: Sep. 10, 2013

(54) SILICON-BASED THIN FILM SOLAR CELL AND METHOD FOR MANUFACTURING SAME

(75) Inventors: Kunta Yoshikawa, Settsu (JP); Mitsuru Ichikawa, Settsu (JP); Kenji Yamamoto, Settsu (JP)

(73) Assignee: Kaneka Corporation, Osaka-shi (JP)

( * ) Notice: Subject to any disclaimer, the term of this patent is extended or adjusted under 35 U.S.C. 154(b) by 146 days.

(21) Appl. No.: 13/124,384

(22) PCT Filed: Oct. 9, 2009

(86) PCT No.: PCT/JP2009/067636
§ 371 (c)(1),
(2), (4) Date: Apr. 14, 2011

(87) PCT Pub. No.: WO2010/044378
PCT Pub. Date: Apr. 22, 2010

(65) Prior Publication Data
US 2011/0197957 A1    Aug. 18, 2011

(30) Foreign Application Priority Data

Oct. 14, 2008  (JP) ................................ 2008-265327

(51) Int. Cl.
*H01L 21/00*   (2006.01)
(52) U.S. Cl.
USPC ............... 438/75; 136/243; 136/258; 257/53; 257/431; 257/E31.043
(58) Field of Classification Search
USPC ............ 438/57, 96, 97; 257/53, 65, E31.04, 257/E31.043, E31.044, E31.045, E31.047, 257/E31.048
See application file for complete search history.

(56) References Cited

U.S. PATENT DOCUMENTS 5,977,476 A * 11/1999 Guha et al. .................... 136/249
6,337,224 B1   1/2002 Okamoto et al.
(Continued)

FOREIGN PATENT DOCUMENTS

CN      101246929 A    8/2008
JP       3263878 A    11/1991
(Continued)

OTHER PUBLICATIONS

ISA The International Bureau of WIPO, International Preliminary Report on Patentability for International Application No. PCT/JP2009/067636, May 26, 2011, 6 pages.

(Continued)

Primary Examiner — Julio J Maldonado
Assistant Examiner — Joseph Galvin, III
(74) Attorney, Agent, or Firm — Alleman Hall McCoy Russell & Tuttle LLP

(57) ABSTRACT

A method for manufacturing a silicon-based thin film solar cell including a crystalline silicon photoelectric conversion unit which contains a p-type layer (4p), a crystalline i-type silicon photoelectric conversion layer (4ic), and an n-type layer (4nc) stacked in this order from a transparent substrate side is provided. In one example, an n-type silicon-based thin film layer (4na) is formed on the crystalline i-type silicon photoelectric conversion layer (4ic), the n-type silicon-based thin film layer (4na) having an n-type silicon alloy layer having a film thickness of 1-12 nm and being in contact with the crystalline i-type silicon photoelectric conversion layer.

7 Claims, 5 Drawing Sheets

(56) References Cited

U.S. PATENT DOCUMENTS

| | | | |
|---|---|---|---|
| 2006/0043517 A1* | 3/2006 | Sasaki et al. | 257/458 |
| 2006/0174935 A1* | 8/2006 | Sawada et al. | 136/261 |
| 2010/0147379 A1* | 6/2010 | Kishimoto | 136/258 |

FOREIGN PATENT DOCUMENTS

| | | |
|---|---|---|
| JP | 10294482 A | 11/1998 |
| JP | 11-186574 A | 7/1999 |
| JP | 11-330520 | 11/1999 |
| JP | 2002-246619 A | 8/2002 |
| JP | 2006-120712 A | 5/2006 |
| JP | 2007-250865 A | 9/2007 |
| JP | 2007305826 A | 11/2007 |
| WO | 2005/011002 A1 | 2/2005 |

OTHER PUBLICATIONS

ISA Japanese Patent Office, International Search Report of PCT/JP2009/067636, Dec. 22, 2009, 4 pages.

Guo, Lihui et al., "High Rate Deposition of Microcrystalline Silicon Using Conventional Plasma-Enhanced Chemical Vapor Deposition," Japanese Journal of Applied Physics, Part 2, No. 10A, Oct. 1, 1998, 3 pages.

Rech, B. et al., "Amorphous and Microcrystalline Silicon Solar Cells Prepared at High Deposition Rates Using RF (13.56 MHz) Plasma Excitation Frequencies," Technical Digest of the International PVSEC-11, Sapporo, Hokkaido, Japan, 1999, 2 pages.

* cited by examiner

SILICON-BASED THIN FILM SOLAR CELL AND METHOD FOR MANUFACTURING SAME

TECHNICAL FIELD

The invention relates to a silicon-based thin film solar cell and a method for manufacturing thereof. Particularly, the invention relates to a hybrid silicon-based thin film solar cell including an amorphous silicon photoelectric conversion unit and a crystalline silicon photoelectric conversion unit, in this order from a light incident side, and a method for manufacturing thereof.

BACKGROUND ART

In recent years, for realization of both lower cost and higher efficiency of a solar cell, a thin film solar cell, which is made using a small amount of raw materials, has attracted attention and is under intense development. Currently, in addition to a conventional amorphous thin film solar cell, a crystalline silicon thin film solar cell has also been developed, and a stacked solar cell, formed by stacking these cells and called a hybrid solar cell, has also been put into practical use. "Crystalline silicon" or "microcrystalline silicon" is a mixed crystal system of crystal silicon and amorphous silicon, a material whose crystal volume fraction changes depending upon film formation conditions.

The thin film solar cell normally has a photoelectric conversion unit in which a p-type layer (p-type semiconductor layer), an i-type layer (i-type semiconductor layer) and an n-type layer (n-type semiconductor layer) are stacked. As for such a pin-type or nip-type photoelectric conversion unit, regardless of whether the p-type layer or the n-type layer included therein is amorphous or microcrystalline, a photoelectric conversion unit whose i-type layer, taking up a principal part thereof, is amorphous, is called an amorphous silicon photoelectric conversion unit, and a photoelectric conversion unit whose i-type layer is microcrystalline silicon made of mixed crystal of crystal silicon and amorphous silicon is called a crystalline silicon photoelectric conversion unit.

The i-type layer, which is substantially an intrinsic semiconductor layer, occupies a principal part of thickness of the photoelectric conversion unit, and photoelectric conversion mainly occurs in the i-type layer. Therefore, the i-type layer is usually referred to as an i-type photoelectric conversion layer or simply referred to as a photoelectric conversion layer. The photoelectric conversion layer is not limited to the intrinsic semiconductor layer, and it may be a slightly doped p-type or n-type layer as long as loss of light absorbed by impurities (dopant) is not problematic. While the photoelectric conversion layer preferably has a larger thickness for its better light absorption, an excessive increase of the thickness inevitably increases cost and time for depositing the layer.

One of the big challenges in mass production of the thin film solar cell is high-speed film formation of the crystalline i-type silicon photoelectric conversion layer of the crystalline silicon photoelectric conversion unit performed by a CVD method with in-plane uniformity. That is, since crystalline silicon has a small absorption coefficient as compared with amorphous silicon and the crystalline i-type silicon photoelectric conversion layer of the crystalline silicon photoelectric conversion unit is required to have a thickness on the order of ten times as large as the amorphous i-type silicon photoelectric conversion layer of the amorphous silicon photoelectric conversion unit, the film formation of the crystalline i-type silicon photoelectric conversion layer controls a speed of manufacturing of the solar cell including the crystalline silicon photoelectric conversion unit.

On the other hand, although discharge is performed on conditions of high pressure, high hydrogen dilution and high output with an interelectrode distance being in a narrowed state for the high-speed film formation of crystalline silicon (e.g., Patent Document 1, Non-patent Document 1 and Non-patent Document 2), grain boundaries of microcrystalline silicon are prone to be generated and defects are prone to be concentrated on the crystal grain boundaries under the high-speed film formation conditions, thereby causing a problem that a fill factor and an open circuit voltage of the solar cell are prone to decrease. For reduction in density of the defects attributed to the crystal boundaries of the crystalline i-type silicon photoelectric conversion layer, a dilution ratio of hydrogen may be decreased. However, when the dilution ratio of hydrogen is decreased, the crystal volume fraction tends to decrease and become non-uniform, leading to a decrease in short-circuit current of the solar cell. Further, the crystalline silicon photoelectric conversion unit with a low crystal volume fraction also has a problem of being sensitive to photo-degradation.

Meanwhile, although the film thickness of the photoelectric conversion layer is preferably large in order to increase light absorption by the i-type layer so as to enhance the photoelectric conversion efficiency of the solar cell, when the film thickness of the i-type layer is made larger than necessary, the cost and the time for the film formation increases. From such a viewpoint, manufacturing conditions for the crystalline i-type silicon photoelectric conversion layer has hitherto been selected so as to balance a film formation speed and a film quality thereof. That is, for formation of a crystalline i-type silicon photoelectric conversion layer with high film quality, the film formation speed needs to be lowered, and when the film formation speed is prioritized, the film quality deteriorates, thus requiring formation of the crystalline i-type silicon photoelectric conversion layer with a large film thickness. Therefore, an attempt has been made to adjust the film formation conditions for the crystalline i-type silicon photoelectric conversion layer and the film thickness thereof in the trade-off relation between the film formation speed and the film quality, so as to optimize the characteristics and the mass productivity of the solar cell.

On the other hand, it has been proposed that the n-type amorphous silicon layer be formed on the n-type crystalline silicon layer and the crystalline silicon photoelectric conversion layer be formed thereon, thus reducing the crystal grain boundaries and defects in the crystalline silicon photoelectric conversion layer so as to improve photoelectric conversion characteristics (e.g., Patent Document 2). In Patent Document 2, an n-type amorphous silicon layer containing a P element, which functions as a crystallization promoter, acts as an underlayer of the crystalline silicon photoelectric conversion layer. Hence a crystalline photoelectric conversion layer of good quality, in which crystal nucleus generation in the early stage of growth is suppressed, can be obtained and the photoelectric conversion characteristics are improved.

PRIOR ART DOCUMENTS

Patent Documents
Patent Document 1: Japanese Unexamined Patent Publication No. H11-330520
Patent Document 2: Japanese Unexamined Patent Publication No. H10-294482

Non-Patent Documents
Non-patent Document 1: L. Guo et al., Japanese Journal of Applied Physics, Vol. 37, pp. L1116-L1118 (1998)
Non-patent Document 2: B. Rech et. al., Technical Digest of the International PVSEC-11, pp. 241-242 (1999).

SUMMARY OF THE INVENTION

Problems to be Solved by the Invention

In Patent Document 2, the photoelectric conversion layer is formed by plasma enhanced CVD on a low-output condition in order to suppress generation of the crystal nucleus in the early stage of crystal growth. However, when a high-output condition is adopted for increasing the film formation speed, doping impurities diffuse from the n-type amorphous silicon layer as the underlayer, or an incubation layer (area divided into a portion having an extremely high crystal volume fraction and a portion having an extremely low crystal volume fraction) is generated, thereby causing deterioration in photoelectric conversion characteristics. That is, in the case of forming the amorphous silicon layer as the underlayer of the crystalline silicon photoelectric conversion layer, an upper limit of the film formation speed for obtaining the crystalline silicon photoelectric conversion layer in a favorable film state during the early stages of film formation is restricted, and it has thus been difficult to solve the problem of the trade-off between the film formation speed and the film quality as described above, so as to produce a solar cell excellent in both photoelectric conversion characteristics and mass productivity.

In view of such a problem, an object of the present invention is to provide a silicon-based thin film solar cell in which decreases in open circuit voltage and fill factor have been suppressed and conversion efficiency has been improved, and a method of manufacturing thereof. Specifically, an object of the present invention is to provide a method for manufacturing a silicon-based thin film solar cell with high mass productivity even when a crystalline i-type silicon photoelectric conversion layer is formed at high speed or when a crystalline i-type silicon photoelectric conversion layer has a relatively high crystallinity and a number of defects are included in the vicinity of its interface on a back electrode side.

Means for Solving the Problems

The above problem can be solved by formation of an n-type silicon-based thin film layer on and in contact with a crystalline i-type silicon photoelectric conversion layer of a crystalline silicon photoelectric conversion unit.

The present invention relates to a silicon thin film solar cell including a crystalline silicon photoelectric conversion unit having a p-type layer $4p$, a crystalline i-type silicon photoelectric conversion layer $4ic$ and an n-type layer $4nc$ from the transparent substrate 1 side as the light incident side, and a method for manufacturing thereof. The invention is characterized in that an n-type silicon-based thin film layer $4na$ is formed on and in contact with the crystalline i-type silicon photoelectric conversion layer $4ic$, and an n-type microcrystalline silicon layer $4nc$, as an n-type layer, is formed thereon.

The n-type silicon-based thin film layer $4na$ has an n-type silicon alloy layer in contact with the crystalline i-type silicon photoelectric conversion layer $4ic$. The n-type silicon alloy layer preferably has a film thickness of 1 to 12 nm.

The n-type silicon-based thin film layer $4na$ is preferably formed by depositing an n-type amorphous silicon layer $4n2$ on the n-type silicon alloy layer $4n1$. Further, the n-type amorphous silicon layer $4n2$ is preferably formed so as to have a film thickness which is 60% or more of a film thickness of a whole of the n-type silicon-based thin film layer $4na$.

The n-type silicon alloy layer $4n1$ preferably consists essentially of a hydrogen element, a silicon element, and one or more elements selected from oxygen, carbon and nitrogen. The n-type silicon alloy layer $4n1$ is preferably an n-type amorphous silicon carbide layer.

In the solar cell of the invention having above configuration, the crystalline i-type silicon photoelectric conversion layer is formed at an average film formation rate of preferably 0.5 nm/sec or more, more preferably 0.8 nm/sec or more, and further preferably 1.2 nm/sec or more.

In an embodiment of the invention, the silicon-based thin film solar cell is a hybrid silicon-based film solar cell, in which the crystalline silicon photoelectric conversion unit is formed on an amorphous silicon photoelectric conversion unit having a p-type layer $3p$, an amorphous i-type silicon photoelectric conversion layer $3ia$ and an n-type layer $3n$ in this order from the transparent substrate 1 side.

Effects of the Invention

According to the present invention, since the n-type silicon alloy layer in the n-type silicon-based thin film layer $4na$ formed on the crystalline i-type silicon photoelectric conversion layer $4ic$ has a wide gap and is excellent in electron collecting effect on a valence band side, it is possible to obtain a solar cell with a high open circuit voltage. Further, since the n-type silicon alloy layer is doped in n-type, it is possible to suppress recombination of carriers due to entry of holes (hole repelling effect).

Further, as shown in FIG. 2, when an n-type amorphous silicon layer $4n2$ is deposited on an n-type silicon alloy layer $4n1$, the n-type silicon alloy layer $4n1$ functions as an underlayer of the n-type amorphous silicon layer $4n2$, and by a crystallization inhibiting effect of a different type of element such as oxygen, carbon or nitrogen in the silicon alloy layer, the layer $4n2$ can be deposited as the amorphous silicon layer. With such a configuration, a film thickness of the n-type silicon alloy layer $4n1$ with large resistance is made small to suppress an increase in series resistance while maintaining the effect of improving the open circuit voltage by collection of electrons on the valence band side and suppression of recombination of carriers as described above. It is thus possible as a result to obtain a thin-film solar cell having higher conversion efficiency.

MODE FOR CARRYING OUT THE INVENTION

Hereinafter, a silicon-based thin film solar cell and a method for manufacturing thereof as an embodiment of the present invention will be described with reference to the drawings.

Figure 1:
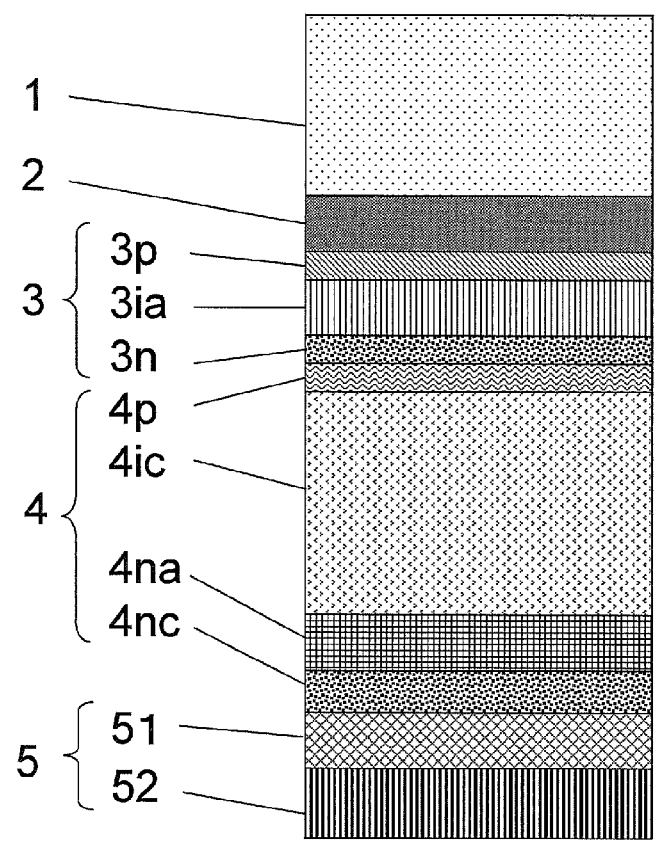
FIG. 1 is a schematic cross-sectional view of a pin-type hybrid silicon-based thin film solar cell according to one embodiment of the present invention.

FIG. 1 shows a hybrid silicon-based thin film solar cell in which a transparent conductive film 2, an amorphous silicon photoelectric conversion unit 3, a crystalline silicon photoelectric conversion unit 4 and a back electrode 5 are formed in this order on a transparent substrate 1.

[Transparent Substrate]

For the transparent substrate 1, a plate-like member or a sheet-like member made of glass, a transparent resin, or the like is used. For a transparent conductive film 2, a conductive metal oxide is preferably used; specifically, $SnO_2$, ZnO and the like may be preferred examples thereof. The transparent conductive film 2 is preferably formed by methods of CVD, sputtering, evaporation, or the like.

[Transparent Conductive Film]

As the transparent conductive film 2, a transparent conductive film capable of exerting an effect of increasing diffusion of incident light on its surface is preferably used. Specifically, the transparent conductive film 2 capable of exerting the effect of increasing diffusion of incident light by fine roughness formed therein is desirable.

[Amorphous Silicon Photoelectric Conversion Unit]

The amorphous silicon photoelectric conversion unit 3 is formed on the transparent conductive film 2. The amorphous silicon photoelectric conversion unit 3 has a first p-type layer 3p, an amorphous i-type silicon photoelectric conversion layer 31a and a first n-type layer 3n formed in this order from the transparent substrate side.

Each layer of the amorphous silicon photoelectric conversion unit 3 can be formed by various known methods, and among the methods, a high-frequency plasma enhanced CVD method is suitably used. As conditions for forming each layer of the amorphous silicon photoelectric conversion unit, for example, a substrate temperature of 100 to 300° C., a pressure of 20 to 2600 Pa, and a plasma output of 0.003 to 0.6 W/cm$^2$ are preferably used. Examples of a source gas for use in formation of each layer of the photoelectric conversion unit include a silicon-containing gas such as $SiH_4$ and $Si_2H_6$, and mixtures of these gases with $H_2$. As a dopant gas for forming the first p-type layer 3p and the first n-type layer 3n, $B_2H_6$ or the like and $PH_3$ or the like are preferably used respectively.

It is to be noted that, although amorphous silicon which is the same material as that for the amorphous i-type silicon photoelectric conversion layer 3ia may be used for the first p-type layer 3p and the first n-type layer 3n, a material with a wider band than that of the photoelectric conversion layer is also preferably used. The use of the material with a wide band forms a new electric field on an interface between the conductive layer and the photoelectric conversion layer, to suppress recombination of carriers, having occurred associated with light absorption, on the interface. Further, with the use of the material with a wide band, such as p-type amorphous silicon carbide, as the first p-type layer 3p arranged on the light incident side of the amorphous i-type silicon photoelectric conversion layer 3ia, it is possible to reduce the light absorption in other than the photoelectric conversion layer, so as to improve photoelectric conversion characteristics.

[Crystalline Silicon Photoelectric Conversion Unit]

The crystalline silicon photoelectric conversion unit 4 is formed on the amorphous silicon photoelectric conversion unit 3. The crystalline silicon photoelectric conversion unit 4 has a second p-type layer 4p, a crystalline i-type silicon photoelectric conversion layer 4ic, an n-type silicon-based thin film layer 4na, and a second n-type layer 4nc formed in this order.

<Crystalline i-Type Silicon Photoelectric Conversion Layer>

The crystalline i-type silicon photoelectric conversion layer 4ic is formed by a plasma enhanced CVD method by means of various known methods. From the viewpoint of enhancing mass productivity, its average film formation rate is preferably 0.5 nm/sec or more, more preferably 0.8 nm/sec or more, and further preferably 1.2 nm/sec or more.

Since optimal conditions for performing high-speed film formation of the crystalline i-type silicon photoelectric conversion layer vary depending upon film formation apparatuses, the conditions cannot be uniformly defined. However, as disclosed in Patent Document 1, Non-patent Document 1 and Non-patent Document 2 as mentioned above, it is preferable to perform discharge on conditions of high pressure, high hydrogen dilution and high output with an interelectrode distance being in a narrowed state. For example, a distance between a substrate surface for film formation and the electrode is preferably 10 mm or less, more preferably 8 mm or less, and further preferably 7.7 mm or less. Moreover, the distance between the substrate surface for film formation and the electrode is preferably 5.5 mm or more, and more preferably 6.5 mm or more. When the interelectrode distance is excessively large, the film formation speed tends to decrease, and when the interelectrode distance is excessively small, generation of plasma between electrodes tends to become difficult.

The pressure at the film formation is preferably 600 Pa or more, more preferably 1500 Pa or more, and further preferably 1800 Pa or more. Moreover, the pressure is preferably 2600 Pa or less, more preferably 2400 Pa or less, and further preferably 2200 Pa or less. When the pressure is excessively low, the film formation speed tends to decrease, and when the pressure is excessively high, the silicon film is prone to become porous.

The plasma output at film formation is preferably 0.1 W/cm$^2$ or more, more preferably 0.2 W/cm$^2$ or more, and further preferably 0.25 W/cm$^2$ or more. Moreover, the plasma output is preferably 0.7 W/cm$^2$ or less, more preferably 0.5 W/cm$^2$ or less, and further preferably 0.45 W/cm$^2$ or less. When the plasma output is excessively low, the film formation speed tends to decrease, and when the plasma output is excessively high, an underlayer is prone to be etched.

A dilution ratio ($H_2/SiH_4$) of hydrogen gas to silane gas is preferably 200:1 or less, more preferably 100:1 or less, and further preferably 80:1 or less. Moreover, the dilution ratio is preferably 55:1 or more, more preferably 60:1 or more, and further preferably 65:1 or more. When the dilution ratio of hydrogen is excessively high, a number of crystal grain boundaries tend to occur in the crystalline i-type silicon photoelectric conversion layer, leading to an increase in density of defects attributed to the boundaries. When the dilution ratio of hydrogen is excessively low, a crystal volume fraction is prone to decrease and become non-uniform, leading to a decrease in short-circuit current of the solar cell and deterioration in light.

Crystal volume fraction is one of indexes for evaluating characteristics of the crystalline i-type silicon photoelectric conversion layer 4ic. The crystal volume fraction can be obtained by Raman spectrum. That is, laser with a wavelength of 633 nm is irradiated from the film forming direction side of the crystalline i-type silicon photoelectric conversion layer (=opposite side to the transparent substrate of the solar cell), to measure a Raman spectrum. The larger a ratio ($I_1/I_2$) of a peak intensity $I_1$ of a peak present at 520 cm$^{-1}$ to an average intensity $I_2$ at 480 to 490 cm$^{-1}$, the larger the crystal volume fraction.

Generally, when the film formation speed is increased by increasing the plasma output and narrowing the interelectrode distance, the crystal volume fraction tends to become high. When the crystal volume fraction is high, a short-circuit current density increases, but conversely, the number of defects attributed to the crystal grain boundaries increase, whereby the open circuit voltage and the fill factor tend to decrease, leading to a decrease in photoelectric conversion efficiency. On the other hand, when the film formation speed is increased by increasing a partial pressure of silane, by decreasing the dilution ratio ($H_2/SiH_4$) of hydrogen gas to silane gas or by increasing the pressure, the crystal volume fraction tends to decrease and a distribution of crystal grains tends to become non-uniform, leading to a decrease in short-circuit current density.

However, in the present invention, as described later, the n-type silicon-based thin film layer 4na is formed on the crystalline i-type silicon photoelectric conversion layer 4ic, thereby to suppress the decreases in open circuit voltage and fill factor. Therefore, even when the crystalline i-type silicon photoelectric conversion layer 4ic is formed at high speed, the photoelectric conversion efficiency can be held high, to eliminate the need for making the film thickness of the crystalline i-type silicon photoelectric conversion layer 4ic excessively large, and it is thus possible to enhance the mass productivity of the solar cell.

From such a viewpoint, the present invention is effective in the case where the film formation speed of the crystalline i-type silicon photoelectric conversion layer 4ic is high and in the case where the present invention is applied to manufacturing of the solar cell with the crystalline i-type silicon photoelectric conversion layer 4ic having a high crystal volume fraction. For such a crystalline i-type silicon photoelectric conversion layer 4ic, the intensity ratio $I_1/I_2$ of the Raman spectrum is preferably 4.8 or more, more preferably 5 or more, and further preferably 5.3 or more. The upper limit of the intensity ratio $I_1/I_2$ is not particularly restricted, but is typically 6.2 or less, and is preferably 5.8 or less.

<n-Type Silicon-Based Thin Film Layer>

The n-type silicon-based thin film layer 4na is formed on the crystalline i-type silicon photoelectric conversion layer 41c. The n-type silicon-based thin film layer 4na includes the n-type silicon alloy layer in contact with the crystalline i-type silicon photoelectric conversion layer 4ic.

<n-Type Silicon Alloy Layer>

It is preferable that the n-type silicon alloy layer consists essentially of hydrogen element, silicon element, and one or more elements (different types of elements) selected from oxygen, carbon and nitrogen. It should be noted that the wording "consisting essentially of" these elements means including these elements, a trace amount of doping impurities and inevitably contained impurities. Preferable examples of such an n-type silicon alloy include n-type amorphous silicon carbide, n-type microcrystalline silicon oxide, n-type amorphous silicon nitride, and n-type amorphous silicon oxynitride. Among them, from the viewpoint of keeping series resistance low, the n-type amorphous silicon carbide or the n-type microcrystalline silicon oxide is preferably used for the n-type silicon alloy layer. The n-type amorphous silicon carbide is particularly preferred since film formation by use thereof can be performed with low power and damage on the crystalline i-type silicon photoelectric conversion layer 4ic, as the underlayer at formation of the silicon alloy layer, can be reduced, thereby to suppress diffusion of the doping impurities to the crystalline i-type silicon photoelectric conversion layer.

Further, since the silicon alloy layer includes a different kind of element other than silicon and hydrogen, when the silicon alloy layer and another layer are formed inside the same chamber, the different kind of element released from the chamber wall tends to be mixed into the film and act as a defect, and the need may arise for frequent maintenance of the chamber. In this regard, carbon for use in film formation of silicon carbide has a weak binding force with silicon as compared with other different kinds of elements such as oxygen, and rarely acts as a defect even in the case of being captured into the film. Therefore, adopting the n-type amorphous silicon carbide layer as the silicon alloy layer can lengthen a chamber maintenance cycle even in the case where the crystalline i-type silicon photoelectric conversion layer 4ic and the other layers are successively formed with the silicon alloy layer in the same chamber, and consequently, the mass productivity can also be improved.

Although the method for forming the n-type silicon alloy layer is not particularly restricted, for example, in the case of forming an n-type amorphous silicon carbide by the plasma enhanced CVD method, a mixed gas with a flow ratio of $H_2$=0 to 10, $PH_3$=1 to 4 and $CH_4$=0.5 to 2.0 with respect to $SiH_4$=1 is suitable as a source gas for use in the film formation. As an example of plasma enhanced CVD conditions at the formation of n-type amorphous silicon carbide, a distance between the substrate surface for film formation and the electrode of 15 to 20 mm, a pressure of 30 to 200 Pa, and a plasma output of 0.005 to 0.02 W/cm$^2$ are preferably adopted. Further, in the case of forming n-type microcrystalline silicon oxide by the plasma enhanced CVD method, a mixed gas added with a flow ratio of $PH_3$=4 to 10, $H_2$=150 to 300 and $CO_2$=2 to 5.5 with respect to $SiH_4$=1 is suitable as a source gas for use in the film formation. As an example of plasma enhanced CVD conditions at the formation of n-type microcrystalline silicon oxide, a distance between the substrate surface for film formation and the electrode of 6 to 13 mm, a pressure of 800 to 1800 Pa, and a plasma output of 0.12 to 0.27 W/cm$^3$ are preferably adopted.

Figure 6:
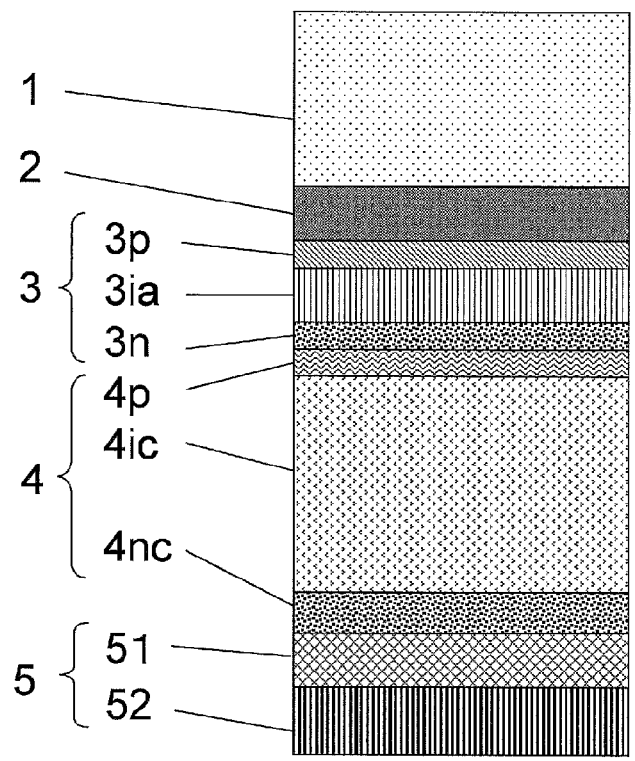
FIG. 6 is a schematic cross-sectional view of a thin film solar cell of a related art.

In this manner, in the present invention, the n-type silicon-based thin film layer 4na having the n-type silicon alloy layer is formed on the crystalline i-type silicon photoelectric conversion layer 4ic. Therefore, as compared with the case of forming the n-type microcrystalline silicon layer 4nc directly on the crystalline i-type silicon photoelectric conversion layer 4ic as shown in FIG. 6, damage to the crystalline i-type silicon photoelectric conversion layer is small, leading to improvement in photoelectric conversion characteristics of the solar cell.

Further, according to the configuration of the present invention, the n-type silicon alloy layer passivates the defects of the crystalline i-type silicon photoelectric conversion layer 41c, thereby improving the fill factor of the solar cell. Further, since the silicon alloy is a wide gap material, an inner potential can be generated by the n-type silicon alloy layer to improve the open circuit voltage of the solar cell. Moreover, since a band gap of the n-type silicon alloy layer is larger than that of the crystalline i-type silicon photoelectric conversion layer 4ic, a band inclination in the vicinity of the interface of valence band becomes large. Therefore, inserting the n-type silicon-based thin film layer 4na improves the hole repelling effect, thus improving the open circuit voltage of the solar cell.

The film thickness of the n-type silicon alloy layer is preferably 1 nm or more, and more preferably 2 nm or more.

When the film thickness of the n-type silicon alloy layer is excessively small, the layer cannot uniformly cover the crystalline i-type silicon photoelectric conversion layer 4ic, and may not be able to sufficiently obtain the defect passivation effect.

Further, the film thickness of the n-type silicon alloy layer is preferably 12 nm or less, more preferably 10 nm or less, further preferably 6 nm or less, and particularly preferably 4 nm or less. Since the n-type silicon alloy has a high resistance, the series resistance tends to increase when the film thickness of the n-type silicon alloy layer is excessively small, leading to a decrease in fill factor of the solar cell.

<n-Type Amorphous Silicon Layer>

Figure 2:
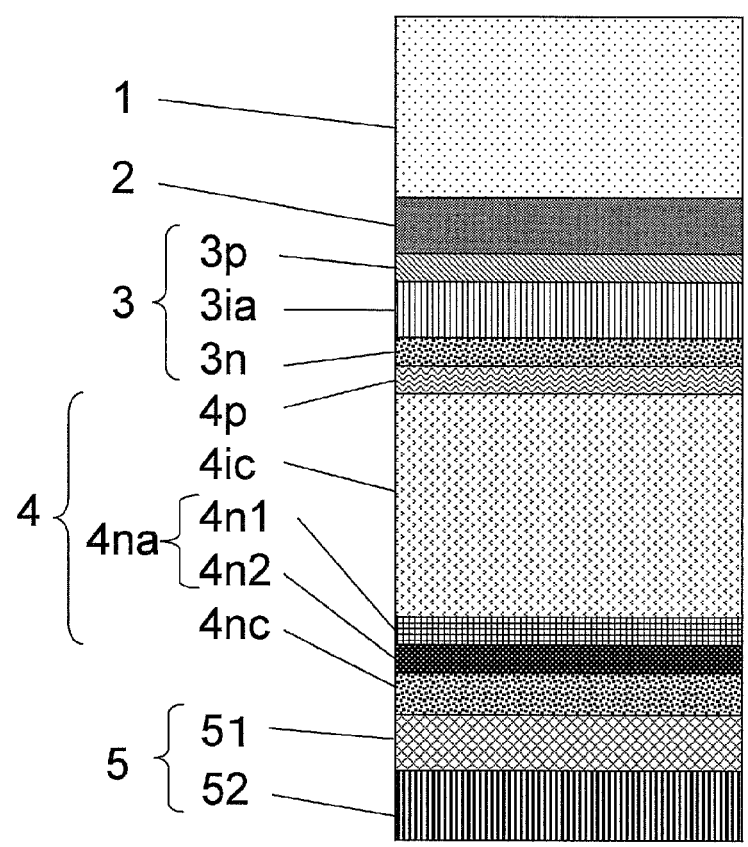
FIG. 2 is a schematic cross-sectional view of a pin-type hybrid silicon-based thin film solar cell according to one embodiment of the present invention.

In a preferred embodiment of the present invention, as shown in FIG. 2, the n-type amorphous silicon layer 4n2 is deposited on the n-type silicon alloy layer 4n1, to form the n-type silicon-based thin film layer 4na. Since the different kind of elements such as oxygen, carbon and nitrogen in the silicon alloy inhibit crystallization, the layer 4n2 formed thereon is formed as the n-type amorphous silicon layer without being influenced by crystallization of the crystalline i-type silicon photoelectric conversion layer 4ic.

That is, in the case of adopting the configuration as in FIG. 2, the n-type silicon alloy layer 4n1 acts as the underlayer for forming the n-type amorphous silicon layer 4n2, and the n-type amorphous silicon layer 4n2 serves as an underlayer of the n-type microcrystalline silicon layer 4nc. Both the n-type silicon alloy layer 4n1 and the n-type amorphous silicon layer 4n2 serve to generate an inner potential inside the crystalline i-type silicon photoelectric conversion layer, and serve to passivate the detects of the crystalline i-type silicon photoelectric conversion layer. Therefore, the film thickness of the n-type silicon alloy layer 4n1 with large resistance is made small to suppress an increase in series resistance while maintaining the effect of improving the open circuit voltage by collection of electrons on the valence band side and suppressing the recombination of carriers as described above, whereby it is possible to obtain the silicon-based thin film solar cell with higher conversion efficiency.

In the configuration of FIG. 2, from the viewpoint of suppressing the increase in series resistance, it is preferable to reduce the film thickness of the n-type silicon alloy layer 4n1 so as to increase the ratio of the film thickness of the n-type amorphous silicon layer 4n2 in the n-type silicon-based thin film layer. The n-type amorphous silicon layer 4n2 is preferably formed so as to have a film thickness which is 60% or more of a film thickness of the whole of the n-type silicon-based thin film layer 4na. The film thickness of the n-type amorphous silicon layer 4n2 is preferably 2 nm or more, more preferably 3 nm or more, and further preferably 4 nm or more. Further, the film thickness of the n-type amorphous silicon layer 4n2 is preferably 19 nm or less, more preferably 12 nm or less, and further preferably 10 nm or less. As an example of plasma enhanced CVD conditions at the formation of the n-type amorphous silicon layer 4n2, a distance between the substrate surface for film formation and the electrode of 10 to 19 mm, a pressure of 30 to 100 Pa, and a plasma output of 0.005 to 0.02 W/cm$^2$ are adopted.

<Contrast Between i-Type Silicon and n-Type Silicon>

A similar defect passivation effect to the case of forming the n-type silicon alloy layer can also be obtained by forming an i-type silicon alloy or i-type amorphous silicon on the crystalline i-type silicon photoelectric conversion layer. Further, when in the case of forming an i-type layer, migration of the doping impurities into the crystalline i-type silicon photoelectric conversion layer can also be suppressed.

On the other hand, in the case of forming an i-type amorphous silicon layer on the crystalline i-type silicon photoelectric conversion layer, since a conduction band has also been extended, electrons are unlikely to be collected from the crystalline i-type silicon photoelectric conversion layer to the n-type layer, which, contrarily, promotes the recombination of carriers. Further, the i-type amorphous silicon layer cannot be said to be suitable in making the crystalline i-type silicon photoelectric conversion layer generate an inner potential, and is not suitable as an underlayer of the microcrystal conductive layer 4nc which is formed thereon. Moreover, since the i-type amorphous silicon layer has a large series resistance as compared with the n-type amorphous silicon layer, the i-type amorphous silicon layer tends to bring about decreases in short-circuit current density and fill factor of the solar cell, which contrarily causes deterioration in photoelectric conversion characteristics.

It should be noted that, even in the case of forming the n-type silicon alloy layer on the crystalline i-type silicon photoelectric conversion layer, a problem similar to the above may occur when n-type doping by means of the impurities is insufficient. From such a viewpoint, in the present invention, the concentration of the n-type doping impurities in the n-type silicon alloy layer is preferably 3000 ppm or more, and more preferably 5000 ppm or more.

In addition, the effect of suppressing recombination of carriers and improving the fill factor can also be obtained in the case of using n-type silicon alloy as in the present invention, although the increase in series resistance may occur. For this reason, in the present invention, the deterioration in fill factor due to the increase in series resistance is minute, and the photoelectric conversion characteristics of the solar cell is improved in combination with improvement in open circuit voltage due to the hole repelling effect as described above.

<n-Type Microcrystalline Silicon Layer>

The n-type microcrystalline silicon layer 4nc is formed as the second n-type layer on the n-type silicon-based thin film layer 4na. Forming the n-type microcrystalline silicon layer 4nc between the n-type silicon-based thin film layer 4na and the back electrode 5 improves electrical contact between the back electrode 5 and a transparent oxide layer 51. The n-type microcrystalline silicon layer 4nc may include one or more elements of any of oxygen, carbon and nitrogen to such a degree as not to increase contact resistance with the back electrode 5. As an example of plasma enhanced CVD conditions at the formation of such an n-type microcrystalline silicon layer 4nc, a distance between the substrate surface for film formation and the electrode of 10 to 13 mm, a pressure of 500 to 1000 Pa, and a plasma output of 0.03 to 0.13 W/cm$^2$ are adopted.

The film thickness of the n-type microcrystalline silicon layer 4nc is preferably 17 nm or more, and more preferably 19 nm or more. When the film thickness of the n-type microcrystalline silicon layer is excessively small, the contact with the back electrode may become insufficient, to prevent the photoelectric conversion characteristics from being exerted. Further, the film thickness of the n-type microcrystalline silicon layer 4nc is preferably 27 nm or less, and more preferably 25 nm or less. When the film thickness of the n-type microcrystalline silicon layer is excessively large, a loss due to light absorption becomes large, whereby a light confinement effect is not sufficiently exerted even in the case of adopting a textured back electrode.

[Back Electrode]

The back electrode 5 is formed on the n-type microcrystalline silicon layer 4nc. As shown in FIGS. 1 and 2, the back electrode 5 is preferably formed in the order of the transparent oxide layer 51 and a back reflective electrode layer 52. As a material for the transparent oxide layer 51, ZnO, ITO, or the like is preferably used, and as a material for the back reflective electrode layer 52, Ag, Al, or an alloy thereof is preferably used. The transparent oxide layer 51 and the back reflective electrode layer 52 can be formed by various known methods, and methods such as sputtering and evaporation are preferably used.

<Contrast with Related Art>

As has been described above, the silicon-based thin film solar cell obtained by the manufacturing method of the present invention has a so-called "superstrate-type" pin-type crystalline silicon photoelectric conversion unit formed with a p-type layer, an i-type layer and an n-type layer in this order from the transparent substrate side which is the light incident side. Hereinafter, for facilitating understanding of the technical concept of the present invention, a description is given of contrast of the present invention with a nip-type crystalline silicon photoelectric conversion unit formed with an n-type layer, an i-type layer and a p-type layer in this order from the light incident side, and a so-called "substrate-type" crystalline silicon photoelectric conversion unit formed with each layer of the crystalline silicon photoelectric conversion unit in this order from the back electrode side on the side opposite to the light incident side.

<Contrast with Nip-Type>

Figure 4:
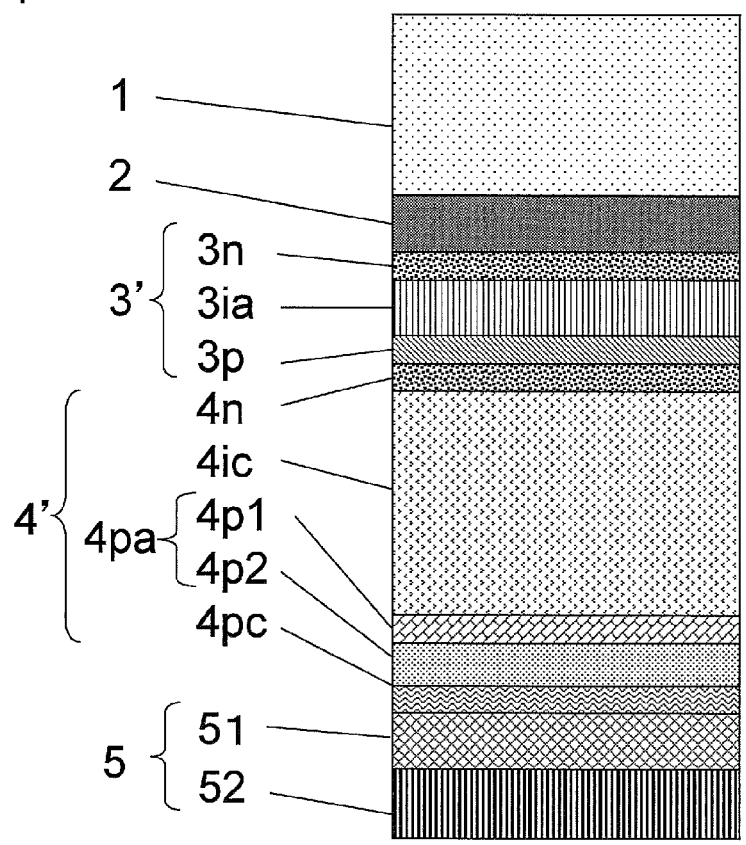
FIG. 4 is a schematic cross-sectional view of a nip-type hybrid silicon-based thin film solar cell.

Also in the case of forming a p-type silicon-based thin film layer 4pa between the crystalline i-type silicon photoelectric conversion layer 4ic and a p-type layer 4pc in formation of a nip-type crystalline silicon photoelectric conversion unit 4' schematically shown in FIG. 4 in which semiconductor layers are formed in the order of n, i and p from the transparent substrate 1 side, it can be assumed that the photoelectric conversion characteristics of the solar cell will be improved due to the defect passivation effect and the hole repelling effect. However, such a nip-type solar cell generally tends to be inferior in the photoelectric conversion characteristics to the pin-type solar cell. Further, p-type doping impurities in a p-type silicon alloy layer 4p1 are diffused to the crystalline i-type silicon photoelectric conversion layer 4ic, to bring about deterioration in photoelectric conversion characteristics of the solar cell.

As in the present invention, diffusion of the n-type doping impurities in the n-type silicon alloy layer 4n1 to the crystalline i-type silicon photoelectric conversion layer 4ic may also occur in the case of forming the n-type silicon alloy layer 4n1 on the crystalline i-type silicon photoelectric conversion layer 4ic. However, a typical crystalline i-type silicon photoelectric conversion layer slightly has n-type conductive characteristics due to the influence of impurities such as oxygen which are contained in a source gas or an environment at the formation of the layer. Therefore, the influence exerted in the case of diffusion of a small amount of n-type doping impurities to the crystalline i-type silicon photoelectric conversion layer is far smaller as compared with an influence exerted in the case of diffusion of the p-type doping impurities, and electric characteristics of the crystalline i-type silicon photoelectric conversion layer 4ic tends to become rather favorable.

Further, in the case of forming the p-type silicon alloy layer 4p1 and a p-type amorphous silicon layer 4p2 on the crystalline i-type silicon photoelectric conversion layer 4ic as shown in FIG. 4, as for band gaps of these layers, p-type silicon alloy has the largest band gap, followed by p-type amorphous silicon and crystalline i-type silicon in the descending order, and hence the conduction band changes discontinuously. Therefore, the inner potential is not favorably formed and the hole collection efficiency tends to deteriorate.

In contrast, in the configuration of the present invention in which the n-type silicon alloy layer 4n1 and the n-type amorphous silicon layer 4n2 are formed on the crystalline i-type silicon photoelectric conversion layer 4ic, since the crystalline i-type silicon photoelectric conversion layer 4ic slightly has the n-type characteristics as described above, fluctuations of the valence band are small as compared with the conduction band, and the inner potential can be formed favorably.

<Contrast with Substrate-Type>

Figure 5:
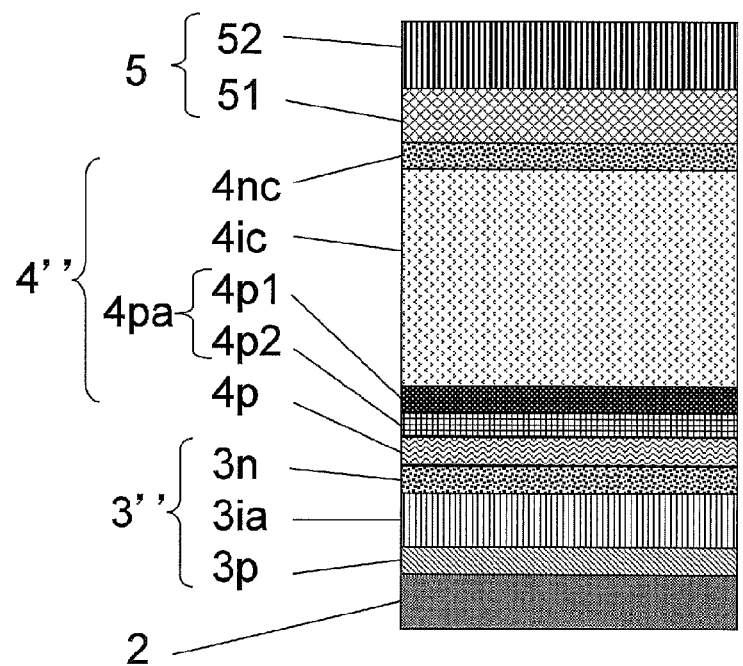
FIG. 5 is a schematic cross-sectional view representing one embodiment of a substrate-type pin-type hybrid silicon-based thin film solar cell, formed with each layer of photoelectric conversion units from a back electrode side.

It is considered that the p-type silicon-based thin film layer 4pa is formed on the light incident side of the crystalline i-type silicon photoelectric conversion layer 4ic also in the so-called "substrate-type" solar cell schematically shown in FIG. 5, in which each layer of the photoelectric conversion units is formed from the back electrode 5 side on the opposite side to the light incident side. However, in such a configuration of the substrate-type, light is absorbed by the p-type silicon-based thin film layer 4pa arranged on the light incident side of the crystalline i-type silicon photoelectric conversion layer 4ic. Specifically, when the n-type silicon-based thin film layer has the amorphous silicon layer 4p2 with a large absorption coefficient, there occurs a problem of increasing the loss due to absorption which does not contribute to photoelectric conversion.

Further, since the light absorption amount per unit film thickness of the photoelectric conversion layer is larger toward the light incident side, light absorption by the photoelectric conversion layer occurs mainly on the light incident side. Therefore, characteristics of the interface of the crystalline i-type silicon photoelectric conversion layer 4ic with the light-incident-side conductive layer are required to be controlled more precisely as compared with the interface with the back-electrode-side conductive layer. However, in the substrate-type solar cell of FIG. 5, the p-type silicon-based thin film layer 4pa is formed on the light incident side of the crystalline i-type silicon photoelectric conversion layer 4ic, and it is thereby difficult to make the interface characteristics favorable, leading to deterioration in photoelectric conversion characteristics.

In contrast, in the case of the superstrate-type solar cell as in the present invention, since the n-type silicon-based thin film layer 4na is formed on the back electrode side of the crystalline i-type silicon photoelectric conversion layer 4ic which contributes to the light absorption amount to a small degree, strict control of the interface characteristics is not required, and contributions to the improvement in photoelectric conversion characteristics due to the defect passivation effect and the hole repelling effect as described above are rather large.

It should be noted that, although the substrate-type solar cell stacked in the order of pin from the light incident side is shown in FIG. 5, in the case of the substrate-type nip-type solar cell, the n-type silicon-based thin film layer is formed on the light incident side of the crystalline i-type silicon photoelectric conversion layer. In this case as well, it is difficult to make the interface characteristics favorable as in the case of the substrate-type pin-type solar cell, leading to deterioration in photoelectric conversion characteristics.

[Embodiment of Stacking Photoelectric Conversion Units]

Figure 3:
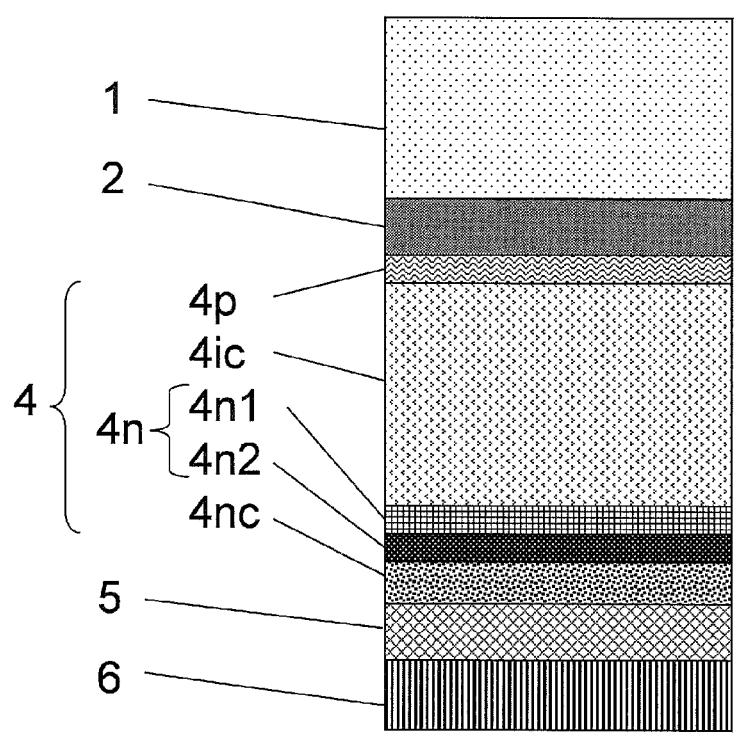
FIG. 3 is a schematic cross-sectional view representing one embodiment of a thin film solar cell having only a crystalline silicon photoelectric conversion unit.

Although FIGS. 1 and 2 each show the thin film silicon solar cell including one each of the amorphous silicon photoelectric conversion unit 3 and the crystalline silicon photoelectric conversion unit 4, the present invention is not restricted to the configuration including one each of the photoelectric conversion units 3 and 4, but is also applicable to a stacked solar cell including three or more photoelectric conversion units. Further, although the present invention is also applicable to a single-cell silicon-based thin film solar cell which only includes the crystalline silicon photoelectric conversion unit as shown in FIG. 3, for a reason described below, it is more preferable to apply the present invention to the hybrid silicon-based thin film solar cell which includes the amorphous silicon photoelectric conversion unit and the crystalline silicon photoelectric conversion unit.

In the case of the hybrid silicon-based thin film solar cell including the amorphous silicon photoelectric conversion unit 3 and the crystalline silicon photoelectric conversion unit 4, the amorphous i-type silicon photoelectric conversion layer 31a and the n-type silicon alloy layer 4n1 and the n-type amorphous silicon layer 4n2 in the n-type silicon-based thin film layer 4na of the crystalline silicon photoelectric conversion unit 4 have almost the same band gaps. On this account, light with such a wavelength as to be absorbable by the n-type silicon-based thin film layer 4na is absorbed by the amorphous i-type silicon photoelectric conversion layer 3ia arranged on the light incident side before the light reaches the n-type silicon-based thin film layer 4na. Therefore, in the case of application of the present invention to the hybrid silicon-based thin film solar cell, it is advantageous in that the loss due to light absorption by the n-type silicon-based thin film layer 4na rarely occurs, and the improvement in photoelectric conversion characteristics made by the present invention can be further efficiently exerted as compared with the case of application to the single-cell thin film solar cell which only has the crystalline silicon photoelectric conversion unit as shown in FIG. 3.

EXAMPLES

Hereinafter, examples of the silicon-based thin film solar cell according to the present invention will be described below with reference to the configuration of FIG. 2 while being contrasted with comparative examples; however, the present invention is not limited to such examples.

Example 1-1

In Example 1-1, the hybrid silicon-based thin film solar cell schematically shown in FIG. 2 was produced in accordance with the following procedure.

First, on one principal surface of the transparent substrate 1 made of a glass substrate with a thickness of 1.1 mm, the transparent conductive film 2 made of $SnO_2$ and having a fine roughness structure on its surface was formed by a thermal CVD method.

Next, in order to form the amorphous silicon photoelectric conversion unit 3, the transparent substrate 1 with the transparent conductive film 2 formed thereon was introduced into a high-frequency plasma enhanced CVD apparatus and heated to 160° C., and thereafter, the amorphous p-type silicon carbide layer 3p with a thickness of 15 nm, the non-doped amorphous i-type silicon photoelectric conversion layer 3ia with a thickness of 300 nm, and the n-type silicon layer 3n with a thickness of 30 nm were sequentially disposed.

Further, in order to form the crystalline silicon photoelectric conversion unit 4, the p-type microcrystalline silicon layer 4p with a film thickness of 15 nm, the crystalline i-type silicon photoelectric conversion layer 4ic with a film thickness of 1.5 μm, the n-type amorphous silicon carbide layer 4n1 with a film thickness of 13 nm, the n-type amorphous silicon layer 4n2 with a film thickness of 5 nm, and the n-type microcrystalline silicon layer 4nc with a film thickness of 20 nm, were sequentially disposed by using plasma enhanced CVD apparatus.

Film formation conditions for the crystalline i-type silicon photoelectric conversion layer 4ic were: a distance between the substrate surface for film formation and the electrode of 7 mm, a pressure of 2200 Pa, a plasma output of 0.4 W/cm², and a $SiH_4/H_2$ flow ratio of 1/72. An average film formation speed in these film formation conditions was 0.79 nm/sec.

Film formation conditions for the n-type amorphous silicon carbide layer 4n1 were: a distance between the substrate surface for film formation and the electrode of 17 mm, a pressure of 120 Pa, a plasma output of 0.008 W/cm², and a $SiH_4/PH_3/CH_4$ flow ratio of 1/2/1. It is to be noted that the $PH_3$ flow rate is shown as a flow rate of a $PH_3/H_2$ mixed gas previously diluted by $H_2$ to 5000 ppm.

Film formation conditions for the n-type amorphous silicon layer 4n2 were: a distance between the substrate surface for film formation and the electrode of 18 mm, a pressure of 60 Pa, a plasma output of 0.011 W/cm², and a $SiH_4/PH_3$ flow ratio of 1/2. Further, film formation conditions for the n-type microcrystalline silicon layer 4nc were: a distance between the substrate surface for film formation and the electrode of 10 mm, a pressure of 800 Pa, a plasma output of 0.11 W/cm², and a $SiH_4/PH_3/H_2$ flow ratio of 1/4/200.

Thereafter, the transparent oxide layer 51 made of ZnO with a thickness of 80 nm was formed by a sputtering method, and the back reflective electrode layer 52 made of Ag with a thickness of 250 nm was formed by an electron-beam evaporation method.

Further, reactive ion etching (RIE) was performed to form an island-shaped separation area in order to separate in island shape the amorphous silicon photoelectric conversion unit 3, the crystalline silicon photoelectric conversion unit 4, the transparent oxide layer 51 and the back reflective electrode layer 52, while leaving the transparent conductive film 2. Thereafter, solder was penetrated in a portion which is 2 mm outside the island-shaped separation area to form a contact area with the transparent conductive film 2, to produce a hybrid silicon-based thin film solar cell. This hybrid silicon-based thin film solar cell has an effective area of 1 cm², and in Example 1, 36 of the above solar cells in total were produced on one substrate.

The produced hybrid silicon-based thin film solar cell was irradiated with pseudo sunlight with a spectral distribution of AM 1.5 and an energy density of 100 mW/cm² under conditions of a measurement atmospheric temperature and a solar cell temperature of 25±1° C., and a voltage and a current were measured, to obtain output characteristics of the thin film solar cell.

Example 1-2

A hybrid silicon-based thin film solar cell was produced according to Example 1-1, with a difference from Example 1-1 in that in Example 1-2, the n-type amorphous silicon layer 4n2 was not formed and the n-type amorphous silicon carbide layer 4n1 was formed to have a film thickness of 8 nm.

Example 1-3

A hybrid silicon-based thin film solar cell was produced according to Example 1-1, with a difference from Example 1-1 in that in Example 1-3, the n-type microcrystalline silicon oxide layer 4n1 was formed as the n-type silicon alloy layer to have a film thickness of 3 nm in place of forming the n-type amorphous silicon carbide layer 4n1 to have a film thickness of 3 nm. Film formation conditions for the n-type microcrystalline silicon oxide layer 4n1 in Example 1-3 were: a distance between the substrate surface for film formation and the electrode of 8 mm, a pressure of 1100 Pa, a plasma output of 0.16 W/cm², and a $SiH_4/PH_3/H_2/CO_2$ flow ratio of 1/6/200/4.

Comparative Example 1-1

A hybrid silicon-based thin film solar cell was produced according to Example 1-1, with a difference from Example 1-1 in that in Comparative Example 1-1, the n-type amorphous silicon layer 4n2 was not formed and the n-type amorphous silicon carbide layer 4n1 was formed to have a film thickness of 14 nm.

Comparative Example 1-2

A hybrid silicon-based thin film solar cell was produced according to Example 1-1, with a difference from Example 1-1 in that in Comparative Example 1-2, the n-type amorphous silicon carbide layer 4n1 was not formed and the n-type amorphous silicon layer 4n2 was formed to have a film thickness of 8 nm.

Comparative Example 1-3

A hybrid silicon-based thin film solar cell was produced according to Example 1-1, with a difference from Example 1-1 in that in Comparative Example 1-3, the n-type amorphous silicon carbide layer 4n1 and the n-type amorphous silicon layer 4n2 were not formed and the n-type microcrystalline silicon layer 4nc was formed to have a film thickness of 28 nm.

Comparative Example 1-4

A hybrid silicon-based thin film solar cell was produced according to Example 1-1, with a difference from Example 1-1 in that in Comparative Example 1-4, a non-doped i-type amorphous silicon carbide layer was formed to have a film thickness of 3 nm in place of forming the n-type amorphous silicon carbide layer 4n1 to have a film thickness of 3 nm, and a non-doped i-type amorphous silicon layer was formed to have a film thickness of 5 nm in place of forming the n-type amorphous silicon layer 4n2 to have a film thickness of 5 nm.

Comparative Example 1-5

A hybrid silicon-based thin film solar cell was produced according to Example 1-2, with a difference from Example 1-2 in that in Comparative Example 1-5, the non-doped i-type amorphous silicon layer was formed to have a film thickness of 8 nm in place of forming the n-type amorphous silicon layer 4n2 to have a film thickness of 8 nm.

Comparative Example 1-6

A hybrid silicon-based thin film solar cell was produced according to Example 1-2, with a difference from Example 1-2 in that in Comparative Example 1-6, the n-type amorphous silicon carbide layer 4n1 was formed to have a film thickness of 15 nm and the n-type amorphous silicon layer 4n2 and the n-type microcrystalline silicon layer 4nc were not formed.

Table 1 shows a stacking structure between the crystalline i-type silicon photoelectric conversion layer and the back electrode, and a film thickness of each layer, of each of the hybrid silicon-based thin film solar cells produced in Examples and Comparative Examples, and a short-circuit current (Isc), an open circuit voltage (Voc), a fill factor (FF) and a photoelectric conversion efficiency (Eff) of each hybrid silicon-based thin film solar cell (average of the 36 cells). "Rate of change" in the table represents an amount of change in photoelectric conversion efficiency in the case of regarding Comparative Example 1-3 as a reference (0%).

Further, "n:a-SiC", "n:uc-SiO", "n:a-Si", "i:a-SiC", "i:a-Si", "n:uc-Si" in Table 1 respectively represent the "n-type amorphous silicon carbide", "n-type microcrystalline silicon oxide", "n-type amorphous silicon", "i-type amorphous silicon carbide", "i-type amorphous silicon", and "n-type microcrystalline silicon" (the same also applies to FIGS. 2 and 3).

TABLE 1

| | Structure of solar cell | 4n1 nm | 4n2 nm | 4nc nm | Isc mA | FF | Voc mV | Eff % | Rate of change % |
|---|---|---|---|---|---|---|---|---|---|
| Example | 1-1 i: uc-Si/n: a-SiC/n: a-Si/n: uc-Si | 3 | 5 | 20 | 12.01 | 0.752 | 1413 | 12.76 | 4.1 |
| | 1-2 i: uc-Si/n: a-SiC/n: uc-Si | 8 | — | 20 | 12.08 | 0.740 | 1416 | 12.66 | 3.2 |
| | 1-3 i: uc-Si/n: uc-SiO/n: a-Si/n: uc-Si | 3 | 5 | 20 | 11.87 | 0.755 | 1422 | 12.74 | 3.9 |
| Comparative | 1-1 i: uc-Si/n: a-SiC/n: uc-Si | 14 | — | 20 | 10.83 | 0.638 | 1425 | 9.85 | −19.7 |
| Example | 1-2 i: uc-Si/n: a-Si/n: uc-Si | — | 8 | 20 | 11.80 | 0.754 | 1394 | 12.40 | 1.1 |
| | 1-3 i: uc-Si/n: uc-Si | — | — | 28 | 12.01 | 0.748 | 1365 | 12.26 | |
| | 1-4 i: uc-Si/i: a-SiC/i: a-Si/n: uc-Si | 3 | 5 | 20 | 11.89 | 0.714 | 1376 | 11.69 | −4.7 |
| | 1-5 i: uc-Si/i: a-Si/n: uc-Si | — | 8 | 20 | 11.79 | 0.732 | 1375 | 11.86 | −3.3 |
| | 1-6 i: uc-Si/n: a-SiC | 15 | — | — | — | — | — | — | — |

Although any of the Examples 1-1, 1-2, and the Comparative Example 1-3 has an n layer with a film thickness of nm between the crystalline i-type silicon photoelectric conversion layer and the back electrode, a high open circuit voltage has been obtained in each of the Examples 1-1 and 1-2, parts of which were formed of the n-type silicon-based thin film layer. Further, in Example 1-1 where the n-type amorphous silicon layer 4n2 was formed as the n-type silicon-based thin film layer at the bottom of the n-type amorphous silicon carbide layer 4n1, the fill factor has been further improved while equivalent improvement in open circuit voltage to that in Example 1-2 has been obtained.

Both in Example 1-1 where the n-type amorphous silicon carbide layer was formed and in Example 1-3 where the n-type microcrystalline silicon oxide layer was formed as the n-type silicon alloy layer, improvements are seen in photoelectric conversion characteristics. Specifically, in Example 1-1 where the n-type silicon alloy layer was formed with a low plasma output, the photoelectric conversion characteristics have been improved as compared with Example 1-3.

In Comparative Example 1-1, where the n-type amorphous silicon carbide layer with a film thickness of 14 nm was formed, the open circuit voltage has been improved as compared with Example 1-3, but due to the n-type amorphous silicon carbide layer having a large film thickness, the series resistance has increased, the fill factor and the short-circuit current have decreased, and the photoelectric conversion efficiency has also decreased.

In Comparative Examples 1-4 and 1-5 where the i-type silicon-based thin film layer was formed between the crystalline i-type silicon photoelectric conversion layer 4ic and the n-type microcrystalline silicon layer 4nc, the open circuit voltage has slightly increased as compared with Comparative Example 1-3, but the open circuit voltage has not increased as much as in Examples 1-2 and 2-1. Meanwhile, the short-circuit current density and the fill factor have decreased as compared with Comparative Example 1-3, and the photoelectric conversion efficiency has also deteriorated.

In Comparative Example 1-5 where the n-type microcrystalline silicon layer 4nc was not formed, electrical contact with the transparent oxide layer 51 was not formed, and the photoelectric conversion characteristics could not be measured.

Examples 2-1 to 2-3 and Comparative Examples 2-1 to 2-5

In Examples 2-1, 2-2, and 2-3, and Comparative Examples 2-1, 2-2, 2-3, 2-4, and 2-5, hybrid silicon-based thin film solar cells were produced, having similar structures and film thicknesses to Examples 1-1, 1-2, and 1-3 and Comparative Examples 1-1, 1-2, 1-3, 1-4, and 1-5, respectively, with differences from Examples 1-1, 1-2, and 1-3 and Comparative Examples 1-1, 1-2, 1-3, 1-4, and 1-5 in that the film formation conditions for the crystalline i-type silicon photoelectric conversion layer 4ic were changed to increase the crystal volume fraction of the i-type silicon photoelectric conversion layer.

Film formation conditions for the crystalline i-type silicon photoelectric conversion layer 4ic in these Examples and Comparative Examples were a distance between the substrate surface for film formation and the electrode of 6.6 mm, a pressure of 2200 Pa, a plasma output of 0.4 W/cm$^2$ and a SiH$_4$/H$_2$ flow ratio of 1/78, and an average film formation speed was 0.73 nm/sec.

Table 2 shows a stacking structure between the crystalline i-type silicon photoelectric conversion layer and the back electrode, and a film thickness of each layer, of each of the hybrid silicon-based thin film solar cells produced in these Examples and Comparative Examples, and a short-circuit current (Isc), an open circuit voltage (Voc), a fill factor (FF), and a photoelectric conversion efficiency (Eff) of each hybrid silicon-based thin film solar cell (average of the 36 cells). "Rate of change" in the table represents an amount of change in photoelectric conversion efficiency in the case of regarding Comparative Example 2-3 as a reference (0%).

TABLE 2

| | Structure of solar cell | 4n1 nm | 4n2 nm | 4nc nm | Isc mA | FF | Voc mV | Eff % | Rate of change % |
|---|---|---|---|---|---|---|---|---|---|
| Example | 2-1 i: uc-Si/n: a-SiC/n: a-Si/n: uc-Si | 3 | 5 | 20 | 12.25 | 0.737 | 1385 | 12.50 | 7.4 |
| | 2-2 i: uc-Si/n: a-SiC/n: uc-Si | 8 | — | 20 | 12.32 | 0.725 | 1388 | 12.40 | 6.5 |
| | 2-3 i: uc-Si/n: uc-SiO/n: a-Si/n: uc-Si | 3 | 5 | 20 | 12.19 | 0.734 | 1390 | 12.44 | 6.8 |
| Comparative | 2-1 i: uc-Si/n: a-SiC/n: uc-Si | 14 | — | 20 | 11.05 | 0.625 | 1397 | 9.65 | −17.2 |
| Example | 2-2 i: uc-Si/n: a-Si/n: uc-Si | — | 8 | 20 | 12.20 | 0.739 | 1376 | 12.41 | 6.5 |
| | 2-3 i: uc-Si/n: uc-Si | — | — | 28 | 12.25 | 0.733 | 1297 | 11.64 | |
| | 2-4 i: uc-Si/i: a-SiC/i: a-Si/n: uc-Si | 3 | 5 | 20 | 12.13 | 0.704 | 1307 | 11.16 | −4.2 |
| | 2-5 i: uc-Si/i: a-Si/n: uc-Si | — | 8 | 20 | 12.03 | 0.721 | 1306 | 11.32 | −2.8 |

Examples 3-1 to 3-3 and Comparative Examples 3-1 to 3-5

In Examples 3-1, 3-2, and 3-3 and Comparative Examples 3-1, 3-2, 3-3, 3-4, and 3-5, hybrid silicon-based thin film solar cells were produced, having similar structures and film thicknesses to Examples 1-1, 1-2, and 1-3 and Comparative Examples 1-1, 1-2, 1-3, 1-4, and 1-5, respectively, with differences from Examples 1-1, 1-2, and 1-3 and Comparative Examples 1-1, 1-2, 1-3, 1-4, and 1-5 in that the film formation conditions for the crystalline i-type silicon photoelectric conversion layer 4ic were changed to increase the average film formation speed.

Film formation conditions for the crystalline i-type silicon photoelectric conversion layer 4ic in these Examples and Comparative Examples were: a distance between the substrate surface for film formation and the electrode of 7 mm, a pressure of 2400 Pa, a plasma output of 0.53 W/cm$^2$ and a SiH$_4$/H$_2$ flow ratio of 1/71, and an average film formation speed was 1.06 nm/sec.

Table 3 shows a stacking structure between the crystalline i-type silicon photoelectric conversion layer and the back electrode, and a film thickness of each layer, of each of the hybrid silicon-based thin film solar cells produced in these Examples and Comparative Examples, and a short-circuit current (Isc), an open circuit voltage (Voc), a fill factor (FF), and a photoelectric conversion efficiency (Eff) of each hybrid silicon-based thin film solar cell (average of the 36 cells). "Rate of change" in the table represents an amount of change in photoelectric conversion efficiency in the case of regarding Comparative Example 3-3 as a reference (0%).

tion is high also in the case of the defect density being high due to high-speed film formation.

TABLE 3

| | Structure of solar cell | 4n1 nm | 4n2 nm | 4nc nm | Isc mA | FF | Voc mV | Eff % | Rate of change % |
|---|---|---|---|---|---|---|---|---|---|
| Example | 3-1 i: uc-Si/n: a-SiC/n: a-Si/n: uc-Si | 3 | 5 | 20 | 12.13 | 0.722 | 1371 | 12.01 | 8.5 |
| | 3-2 i: uc-Si/n: a-SiC/n: uc-Si | 8 | — | 20 | 12.20 | 0.711 | 1374 | 11.91 | 7.6 |
| | 3-3 i: uc-Si/n: uc-SiO/n: a-Si/n: uc-Si | 3 | 5 | 20 | 12.13 | 0.720 | 1374 | 12.00 | 8.4 |
| Comparative | 3-1 i: uc-Si/n: a-SiC/n: uc-Si | 14 | — | 20 | 10.94 | 0.613 | 1383 | 9.26 | −16.3 |
| Example | 3-2 i: uc-Si/n: a-Si/n: uc-Si | — | 8 | 20 | 12.15 | 0.724 | 1362 | 11.99 | 8.3 |
| | 3-3 i: uc-Si/n: uc-Si | — | — | 28 | 12.13 | 0.718 | 1271 | 11.07 | |
| | 3-4 i: uc-Si/i: a-SiC/i: a-Si/n: uc-Si | 3 | 5 | 20 | 12.01 | 0.693 | 1281 | 10.66 | −3.7 |
| | 3-5 i: uc-Si/i: a-Si/n: uc-Si | — | 8 | 20 | 11.91 | 0.708 | 1280 | 10.78 | −2.6 |

<Measurement of Crystal Volume Fraction>

Each of the hybrid silicon-based thin film solar cells obtained in Examples 1-1, 2-1, and 3-1 was immersed into an acetic acid aqueous solution of about 1 wt %, to remove a ZnO layer of the back electrode. From the ZnO layer-removed side of each of the hybrid silicon-based thin film solar cells, a laser with a wavelength of 633 nm was applied to measure a Raman spectrum of the crystalline i-type silicon photoelectric conversion layer. A ratio, $I_1/I_2$, of a peak intensity $I_1$ for a peak present at 520 cm$^{-1}$ to an average intensity $I_2$ at 480 to 490 cm$^{-1}$ in the Raman spectrum was 4.9 in Example 1-1, 5.7 in Example 2-1, and 4.9 in Example 3-1.

According to a measurement result of the Raman spectrum, the crystal volume fraction of the crystalline i-type silicon photoelectric conversion layer is higher in Example 2-1 as compared with Example 1-1, and this is considered to be attributed to the distance between the substrate surface for film formation and the electrode at the film formation being smaller. In Example 2-1, although the short-circuit current of the solar cell has been improved as compared with Example 1-1 due to the high crystal volume fraction of the crystalline i-type silicon photoelectric conversion layer, it is supposed that the number of defects attributed to the crystal grain boundaries is large and the open circuit voltage and the fill factor have deteriorated. On the other hand, when contrasts are made based upon the rate of change in photoelectric conversion efficiency with Comparative Examples 1-3 and 2-3 in which the n-type silicon-based thin film layer 4na is not formed, the rate of improvement is higher in Example 2-1, and this also applies to contrasts with Examples 1-2 and 2-2. It can be supposed therefrom that the effect of improving the photoelectric conversion characteristics by the present invention is high, specifically, in the case of the crystalline i-type silicon photoelectric conversion layer having a high crystal volume fraction and thus having high defect density.

Meanwhile, in contrast between Example 3-1 and Example 1-1, although the crystal volume fractions of the crystalline i-type silicon photoelectric conversion layers are almost the same, it is thought that in Example 3-1, the number of detects has increased and the short-circuit current, the open circuit voltage, and the fill factor have all decreased due to the film formation speed having been made high on a condition of high-pressure CVD. On the other hand, when contrasts are made based upon the rate of change in photoelectric conversion efficiency with Comparative Examples 1-3 and 3-3 in which the n-type silicon-based thin film layer 4na is not formed, the rate of improvement is higher in Example 3-1, and this also applies to contrasts with Examples 1-2 and 3-2. It can be supposed therefrom that the effect of improving the photoelectric conversion characteristics by the present invention is high also in the case of the defect density being high due to high-speed film formation.

Reference Examples 1, 2

As Reference Example 1 and Reference Example 2, thin film solar cells were respectively formed according to Example 1-1 and Comparative Example 1-3, with respective differences from Example 1-1 and Comparative Example 1-3 in that in Reference Example 1 and Reference Example 2, the amorphous silicon photoelectric conversion unit was not formed and the crystalline silicon photoelectric conversion unit 4 was directly formed on the transparent conductive film 2, as shown in FIG. 3. That is, in each of Reference Example 1 and Reference Example 2, the thin film solar cell only having one crystalline silicon photoelectric conversion unit was produced.

Table 4 shows integral current values of spectral sensitivity of each of the hybrid silicon-based thin film solar cells (average value of the 36 cells) produced in Example 1-1, Comparative Example 1-3, Reference Example 1, and Reference Example 2. In the table, "i:a-Si" and "i:uc-Si" respectively represent integral current values of the amorphous silicon photoelectric conversion unit and the crystalline silicon photoelectric conversion unit, and "Total" represents an integral current value of the whole of the solar cell. Further, "Rate of change" represents each of rates of change in integral current values in the case of Example 1-1 with Comparative Example 1-3 regarded as a reference, and in the case of Reference Example 1 with Reference Example 2 regarded as a reference (0%).

TABLE 4

| | 4n1 nm | 4n2 nm | 4nc nm | i: a-Si mA | i: uc-Si mA | Total mA | Rate of change % |
|---|---|---|---|---|---|---|---|
| Example 1-1 | 3 | 5 | 2 | 12.32 | 12.24 | 24.56 | −0.1 |
| Comparative Example 1-3 | — | — | 28 | 12.33 | 12.25 | 24.58 | |
| Reference Example 1 | 3 | 5 | 2 | 0.00 | 21.40 | 21.40 | −4.0 |
| Reference Example 2 | — | — | 28 | 0.00 | 22.30 | 22.30 | |

In the case of comparison between Example 1-1 and Comparative Example 1-3, a change in integral current value of the spectral sensitivity due to insertion of the n-type silicon alloy layer 4n1 and the n-type amorphous silicon layer 4n2 is little. In contrast, in the case of comparison between Reference Example 1 and Reference Example 2, the integral current value has decreased by about 4% in Reference Example 1. This is because a large portion of light incident on the solar cell, which is absorbable by the n-type silicon-based thin film layer 4n, is absorbed during the light passing through the amorphous i-type silicon photoelectric conversion layer 3ia, and the loss due to absorption by the n-type silicon-based thin film layer 4n thus does not occur. On the other hand, in comparison between the Reference Example 1 and Reference Example 2, it is thought that the integral current value has decreased because the absorption loss has occurred due to absorption of light, which should essentially be absorbed inside the crystalline i-type silicon photoelectric conversion layer 4ic, in the n-type silicon-based thin film layer 4na with a high absorption coefficient.

DESCRIPTION OF REFERENCE SIGNS

| | |
|---|---|
| 1 | transparent substrate |
| 2 | transparent conductive film |
| 3 | amorphous silicon photoelectric conversion unit |
| 3p | p-type layer |
| 3i | amorphous i-type silicon photoelectric conversion layer |
| 3n | n-type layer |
| 4 | crystalline silicon photoelectric conversion unit |
| 4p | p-type layer |
| 4ic | crystalline i-type silicon photoelectric conversion layer |
| 4na | n-type silicon-based thin film layer |
| 4n1 | n-type silicon alloy layer |
| 4n2 | n-type amorphous silicon layer |
| 4nc | n-type (microcrystalline silicon) layer |
| 5 | back electrode |
| 51 | transparent oxide layer |
| 52 | back reflective electrode layer |

The invention claimed is:

1. A method for manufacturing a hybrid silicon-based thin film solar cell including an amorphous silicon photoelectric conversion unit and a crystalline silicon photoelectric conversion unit stacked on a transparent substrate side, the method comprising steps of:
in an amorphous unit formation step, forming the amorphous silicon photoelectric conversion unit;
in a crystalline unit formation step, forming the crystalline silicon photoelectric conversion unit on the amorphous silicon photoelectric conversion unit;
wherein the amorphous unit formation step comprises a step of forming a first p-type layer, an amorphous i-type silicon photoelectric conversion layer and a first n-type layer, in this order;
wherein the crystalline unit formation step comprises a step of forming a second p-type layer, a crystalline i-type silicon photoelectric conversion layer, an n-type silicon-based thin film layer, and a second n-type layer, in this order;
wherein the n-type silicon-based thin film layer includes an n-type silicon alloy layer and an n-type amorphous silicon layer thereon, the n-type silicon alloy layer being in contact with the crystalline i-type silicon photoelectric conversion layer and having a film thickness of 1 to 12 nm; and
wherein the second n-type layer formed on the n-type amorphous silicon layer of the n-type silicon-based thin film layer is an n-type microcrystalline silicon layer.

2. The method for manufacturing a silicon-based thin film solar cell according to claim 1, wherein the n-type amorphous silicon layer is formed so as to have a film thickness which is 60% or more of a film thickness of a whole of the n-type silicon-based thin film layer.

3. The method for manufacturing a silicon-based thin film solar cell according to claim 1, wherein the n-type silicon alloy layer consists essentially of a hydrogen element, a silicon element, and one or more elements selected from oxygen, carbon and nitrogen.

4. The method for manufacturing a silicon-based thin film solar cell according to claim 1, wherein the n-type silicon alloy layer is an n-type amorphous silicon carbide layer.

5. The method for manufacturing a silicon-based thin film solar cell according to claim 1, wherein the crystalline i-type silicon photoelectric conversion layer is formed at an average film formation speed of 0.5 nm/sec or more.

6. A silicon-based thin film solar cell produced by the method of manufacturing a silicon-based thin film solar cell according to claim 1.

7. The silicon-based thin film solar cell according to claim 6, wherein, in a Raman spectrum measured by irradiating the crystalline i-type silicon photoelectric conversion layer with a laser having a wavelength of 633 nm from a side opposite to the transparent substrate, a peak present at 520 $cm^{-1}$ exhibits a peak intensity of 4.8 times or more of an average intensity at 480 to 490 $cm^{-1}$.

* * * * *